United States Patent [19]
Ota et al.

[11] Patent Number: 5,400,502
[45] Date of Patent: Mar. 28, 1995

[54] APPARATUS AND METHOD FOR FITTING A PRESS-FIT CONNECTOR TO A PRINTED CIRCUIT BOARD

[75] Inventors: Yasunori Ota; Keiji Yamamoto, both of Tokyo, Japan

[73] Assignee: Ando Electric Co., Ltd., Tokyo, Japan

[21] Appl. No.: 184,059

[22] Filed: Jan. 21, 1994

[30] Foreign Application Priority Data

Jan. 28, 1993 [JP] Japan .................................. 5-032611

[51] Int. Cl.$^6$ .......................... H01R 9/00; B23P 19/00
[52] U.S. Cl. ..................................... 29/845; 29/564.1; 29/739; 29/741
[58] Field of Search .............. 29/845, 739, 741, 33 M, 29/564.1

[56] References Cited

U.S. PATENT DOCUMENTS

| | | | |
|---|---|---|---|
| 3,737,998 | 6/1973 | Bryd ........................ | 29/845 |
| 4,102,043 | 7/1978 | Andrade et al. ............. | 29/739 |
| 4,367,583 | 1/1983 | Baccei ..................... | 29/739 |
| 4,467,523 | 8/1984 | Chisholm .................. | 29/845 |
| 4,503,610 | 3/1985 | Resch ...................... | 29/845 |
| 4,553,322 | 11/1985 | Cappos et al. ............. | 29/739 |
| 4,969,258 | 11/1990 | Fisher et al. .............. | 29/845 |
| 5,074,030 | 12/1991 | Anderson et al. ........... | 29/845 X |
| 5,092,029 | 3/1992 | Fisher et al. .............. | 29/845 X |
| 5,276,962 | 1/1994 | Harting et al. ............. | 29/845 X |

FOREIGN PATENT DOCUMENTS 463693 9/1992 European Pat. Off. ............. 29/845

OTHER PUBLICATIONS

Research Disclosure Jul. 1991 No. 327, "Pin Array Location Technique".

*Primary Examiner*—Carl J. Arbes
*Attorney, Agent, or Firm*—Finnegan, Henderson, Farabow, Garrett & Dunner

[57] ABSTRACT

An apparatus for press-fitting a connector to a printed circuit board, comprising a magazine for accommodating a plurality of connectors (1) for the printed circuit board (8), the connectors (1) having a plurality of pins (1A) each with an outer diameter of an end portion (14) smaller than an outer diameter of an intermediate portion (11); a first transport mechanism (3) for moving a chuck (3A) used to releasably hold a connector (1); an alignment block (4) having alignment apertures (4A) each with a tapered entrance thereto and a diameter larger than the outer diameter of the end portion (14) and smaller than the outer diameter of the intermediate portion (11), provided so as to correspond to the locations of the pins (1A) of the connector (1); a second transport mechanism (5) for moving the alignment block (4) in a horizontal direction; a press head (6) for releasably holding the connector (1); a press (7) for moving the press head (6) in a vertical direction so as to press-fit a connector (1) attached thereto to a printed circuit board (8); and a die (9) for mounting the printed circuit board (8), the die (9) having relief apertures (9A) each with a diameter larger than the outer diameter of the intermediate portion (11), and disposed so as to correspond to the positions of the pins (1A) of the connector (1).

6 Claims, 6 Drawing Sheets

FIG.5(A)(PRIOR ART)
FIG.5(B)(PRIOR ART)
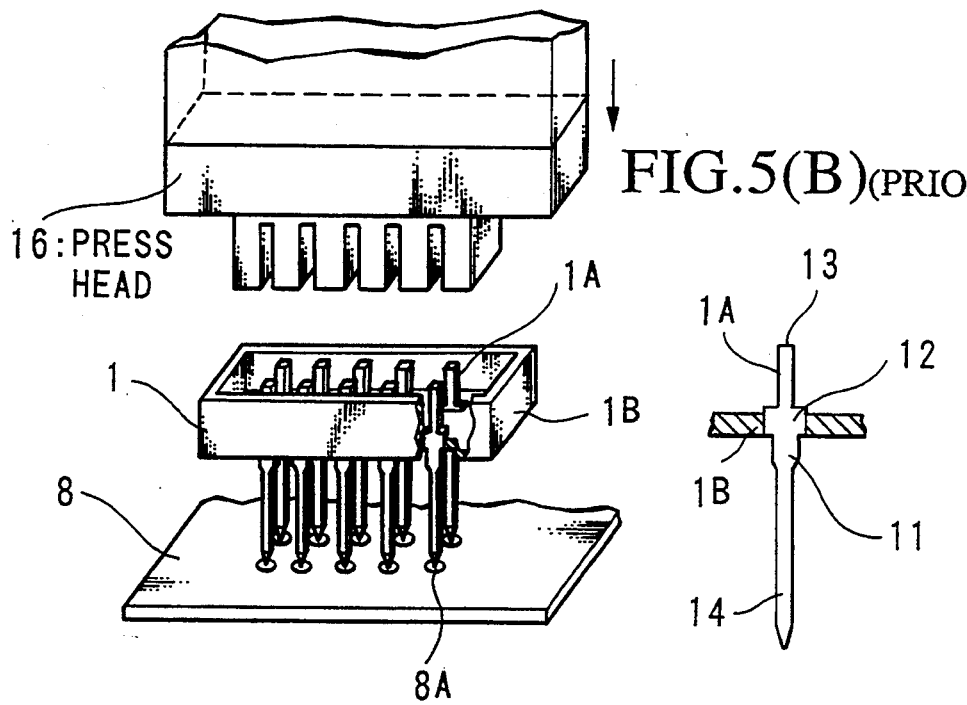
FIG.6(PRIOR ART)
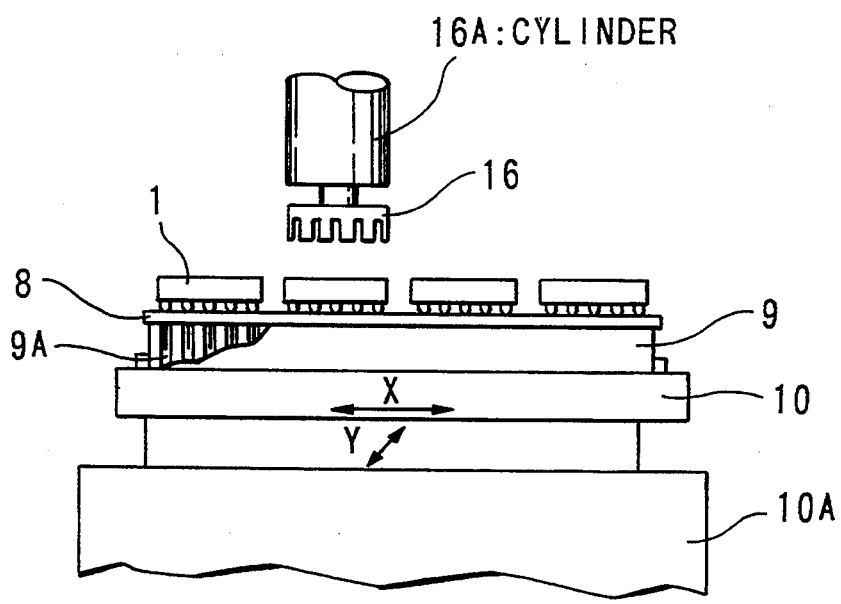

APPARATUS AND METHOD FOR FITTING A PRESS-FIT CONNECTOR TO A PRINTED CIRCUIT BOARD

BACKGROUND OF THE INVENTION

1. Field of the Invention

The present invention relates to an apparatus and a method for fitting a press-fit connector to a printed circuit board. Here a press-fit connector is taken to be a connector such as is used for a non-soldered connection to a printed circuit board, and is referred to thereunder simply as a connector.

2. Description of the Related Art

A connector 1 applicable for use with the present invention is shown in FIG. 5 (A) and FIG. 5 (B). FIG. 5 (A) is perspective view showing the construction of the connector 1, while FIG. 5 (B) is a detailed cross-sectional view of a part of the connector 1 of FIG. 5 (A). As shown in FIGS. 5 (A) and (B), the connector 1 comprises a plurality of pins 1A mounted in a housing 1B, by means of attachment portions 12 on the pins 1A.

In fitting the connector 1 to a printed circuit board 8, at first end portions 14 of the pins 1A are inserted into through holes 8A formed in the printed circuit board 8. The attachment portions 12 of the pins 1A are then pressed down by a press head 16 formed with comb shaped recesses, so that press-fit portions 11 of the pins 1A are press-fitted into the through holes 8A to provide an electrical connection with the printed circuit board 8. It should be noted that the comb shape of the press head 16 is formed to avoid contact with the upper portions 13 of the pins 1A, so that the pins are positively pressed by the attachment portions 12 of the pins 1A.

Next, with reference to FIG. 6, is a description of the construction of a conventional apparatus for press-fitting a connector to a printed circuit board. In FIG. 6, elements the same as those in FIG. 5 are indicated with the same numerals. A die block 9 in FIG. 6 is formed with relief apertures 9A, positioned to correspond to the through holes 8A formed in the printed circuit board 8, so as to accommodate the end portions 14 of the pins 1A. The die block 9 is fixed to a table 10 which is mounted on a bed 10A, so as to be movable in the X and Y axes direction as shown in FIG. 6 under the control of a Numerical Control machine (not shown in the figures).

The conventional apparatus shown in FIG. 6 is seem-automatically operated. In other words, referring to FIG. 7 which shows a condition before pressing the connector 1, the operator mounts the connector 1 on a printed circuit board 8 resting on the die block 9, so that only the end portions 14 of the pins 1A are inserted into the through holes 8A in the printed circuit board 8.

Then, on switching on the apparatus start switch in the condition shown of FIG. 7, the table 10 moves to a predetermined X-Y c.o.-ordinate. The cylinder 16A (see FIG. 6) then lowers the press head 16 so that the front of the press head 16 presses the shoulders of the attachment portions 12 of the pins 1A in a downward direction, thereby pressing the connector 1 against the printed circuit board 8.

FIG. 8 shows the connector 1 in this pressed condition against the printed circuit board 8, with the press-fit portions 11 of the pins 1A pressed fully into the through holes 8A of the printed circuit board 8.

With the conventional apparatus of FIG. 6 however, operating efficiency is low due to the requirement for an operator to half-mount several connectors 1 on the printed circuit board 8 with the end portions 14 of the pins 1A inserted into the through holes 8A.

To fully automate the operation, it is necessary to pre-align a connector 1 having a complicated shape, and deliver this to the printed circuit board 8 in the aligned condition, so that the pins 1A can be inserted into the through holes 8A. However, due to the weak nature of the mounting of the attachment portions 12 in the housing 1B there is the possibility of the pins 1A becoming inclined with respect to the housing 1B during delivery due to bumping etc., so that the pins cannot be properly inserted.

SUMMARY OF THE INVENTION

It is an object of the present invention to address the above problems, and provide an apparatus which can automatically insert a connector into a printed circuit board, and provide a method for such automatic insertion.

The novel features which are believed characteristic of this invention are set forth in the appended claims. The invention itself, however, together with additional objects and advantages thereof will be best understood from the following detailed description taken in conjunction with the accompanying drawings which illustrate, by way of example only, one preferred embodiment of the invention.

BRIEF DESCRIPTION OF THE DRAWINGS

FIG. 2 (B) is a detailed elevation view of part of the apparatus shown in FIG. 1;

FIG. 5 (A) is a perspective view showing the connector positioned ready for fitting to a printed circuit board;

FIG. 5 (B) is a sectional view showing the mounting of a pin to the housing of the connector;

FIG. 6 is a side view showing of the construction of a conventional apparatus for press-fitting connectors;

DESCRIPTION OF THE PREFERRED EMBODIMENTS

Figure 1:
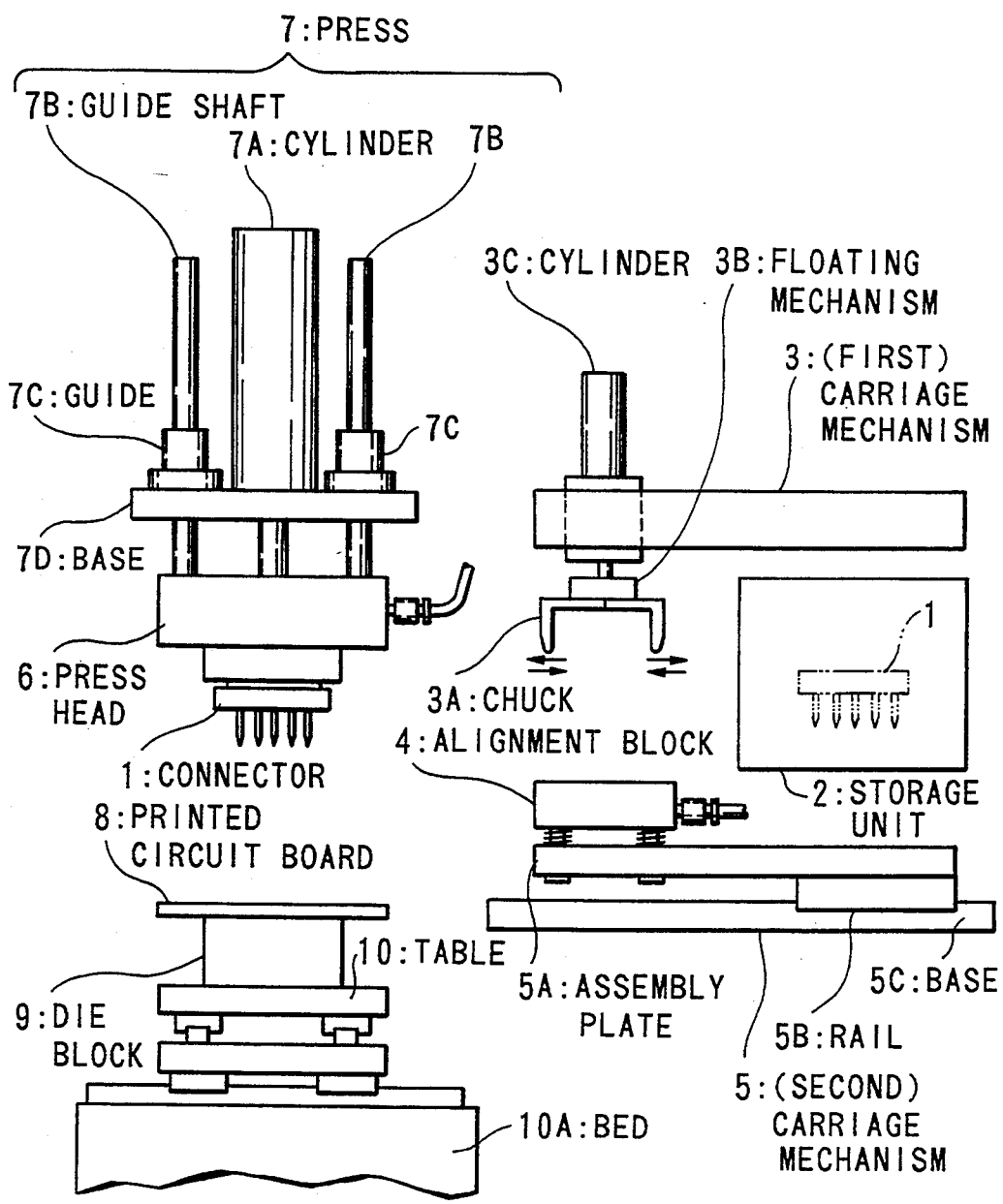
FIG. 1 is a side view showing the construction of the apparatus according to the present invention.

Referring to FIG. 1, a plurality of connectors 1 are stored in a storage unit 2. A chuck 3A which is connected to a carriage mechanism 3 by way of a floating mechanism 3B and cylinder 3C, is moved horizontally by the carriage mechanism 3 between the storage unit 2 and an alignment block 4, and is moved vertically by the cylinder 3C.

The alignment block 4 is resiliently mounted on one end of a long rectangular assembly plate 5A of a second carriage mechanism 5, which comprises a base 5C and a rail 5B whereby the assembly plate 5A is moved horizontally.

When a connector 1 held by the chuck 3A, is placed on the alignment block 4, the pins 1A are inserted into alignment apertures 4A (to be described later) in the alignment block 4 so that the pins 1A are all aligned, thus correcting any misalignment. The assembly plate 5A is then moved horizontally (to the left in FIG. 1) by the carriage mechanism 5. As a result the alignment block 4 is moved from the point where the connector 1 is inserted by the chuck 3A, to a position immediately below a press head 6.

The press head 6 which holds the connector 1 under vacuum as explained later, is connected to a cylinder 7A of a press 7. The press 7 is provided with guides 7C on both sides of a base 7D for guide shafts 7B which guide the press head 6 as it is moved vertically by the cylinder 7A.

Figure 2A:
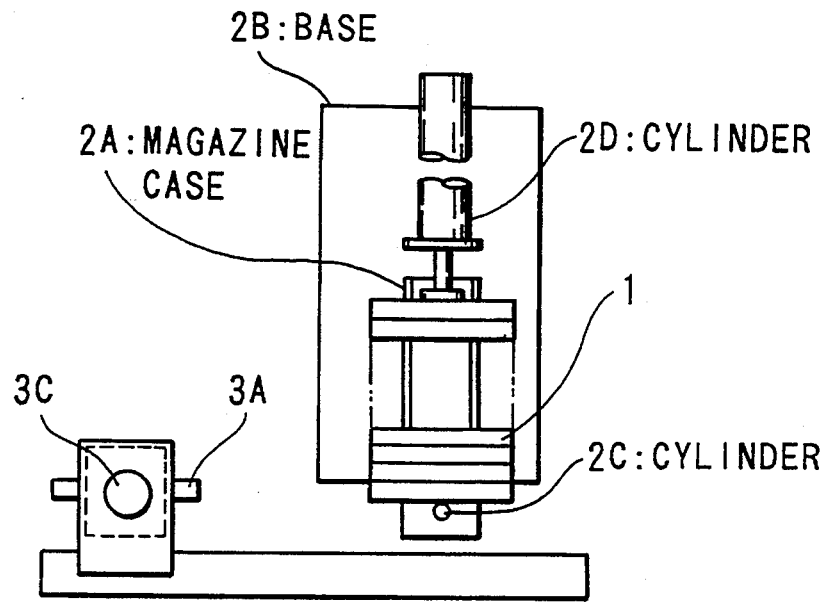
FIG. 2 (A) is a detailed plan view of part of the apparatus shown in FIG. 1.

FIGS. 2 (A) and (B) show respective detailed plan and elevation views of the storage unit 2 shown in FIG. 1.

As shown in FIGS. 2 (A) and (B), a U-shaped magazine case 2A supporting a plurality of connectors 1 with pins 1A directed downwards, is seated on a base 2B.

FIG. 2 (B), shows a condition wherein a piston rod of a cylinder 2C is raised, and the plurality of connectors 1 supported by the U-shaped magazine case 2A are pressed towards the cylinder 2C end of the magazine case 2A by the operation of a cylinder 2D.

Figure 2B:
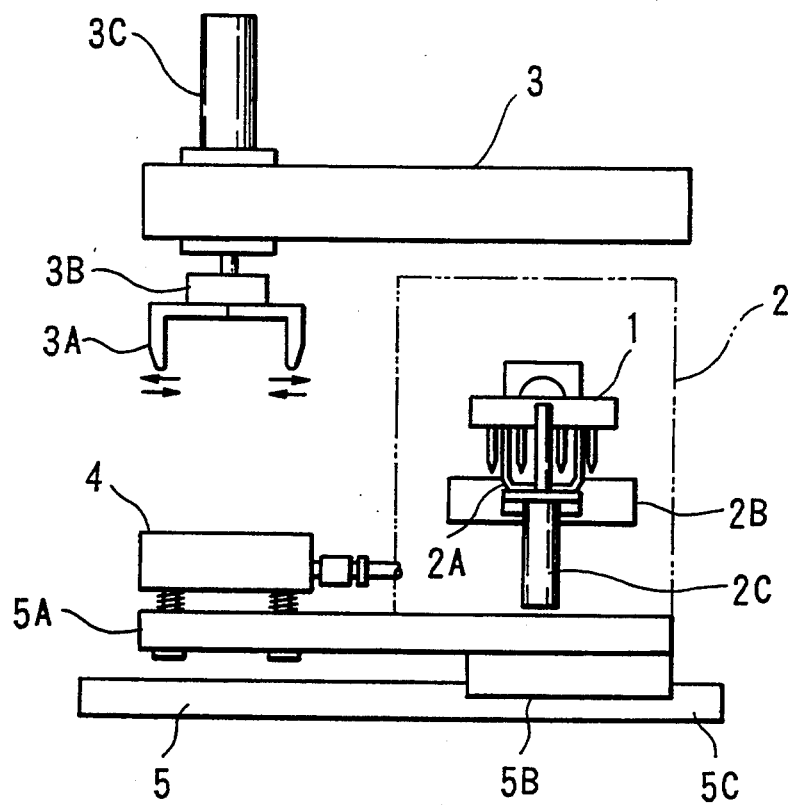

After the condition shown in FIG. 2(B), the piston rod of the cylinder 2C is lowered, and the chuck 3A picks up the connector 1 positioned at the head end in the magazine case 2A (the front end in FIG. 2B). After removal of the head end connector 1, the piston rod of the cylinder 2C is again raised and another connector 1 is pushed toward the cylinder 2C end by the operation of the cylinder 2D.

Figure 3:
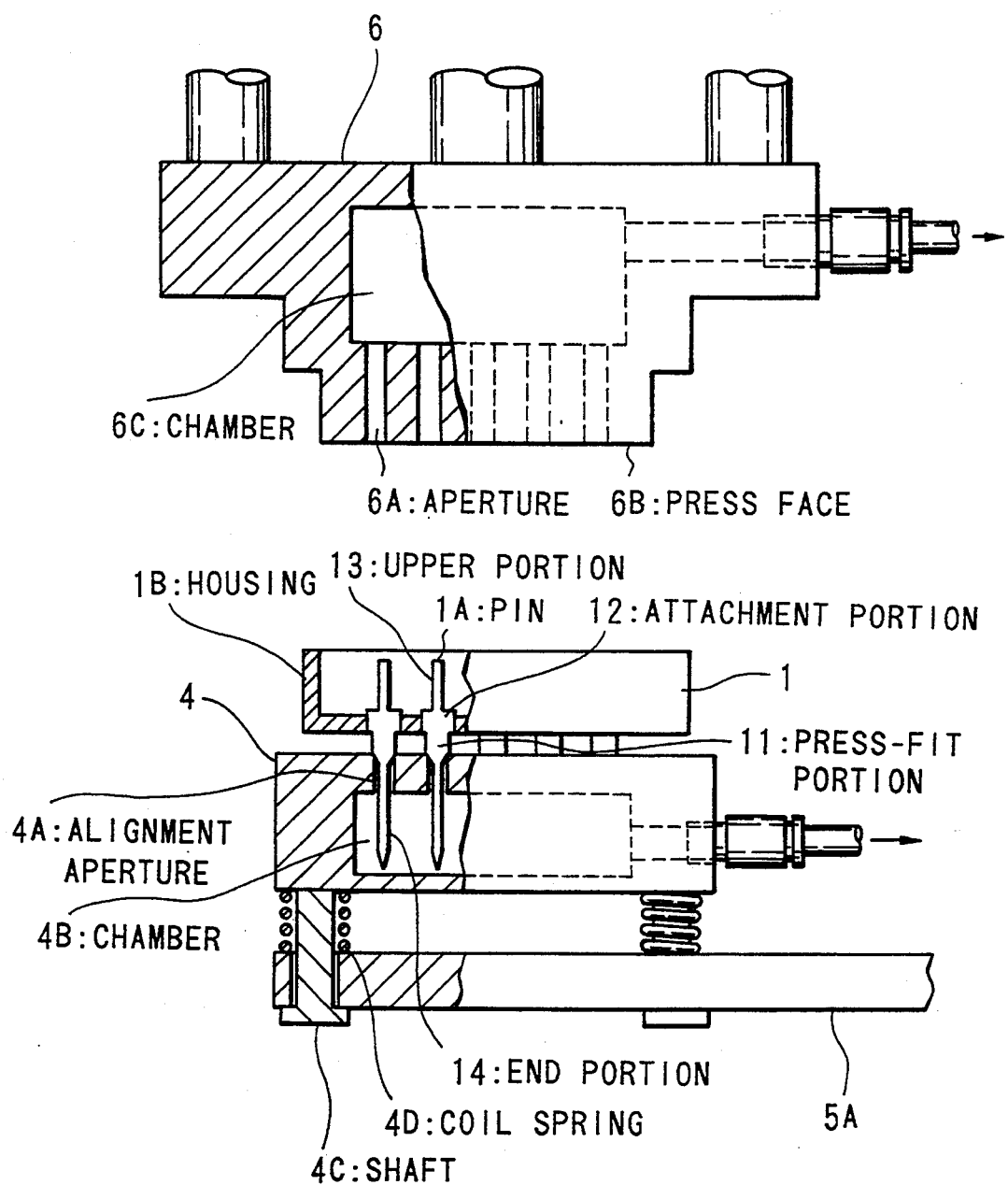
FIG. 3 is a partially cut away enlarged side view of part of the apparatus of FIG. 1, showing an alignment block moved into position below a press head.

FIG. 3 is a partially sectioned view, showing the structural details of the alignment block 4 and the press head 6 shown in FIG. 1, with the connector 1 fitted to the alignment block 4, and the alignment block 4 moved into position beneath the press head 6 (this positioning is discussed later).

As shown in FIG. 3, the alignment block 4 is provided with alignment apertures 4A for accommodating the pins 1A of the connector 1. The alignment apertures 4A are formed with a tapered entrance and with a diameter larger than the outer diameter of the end portion 14 of the pin 1A, but smaller than the diameter of the press-fit portion 11 of the pin 1A.

The chuck 3A shown in FIG. 1 is supported by the floating mechanism 3B so as to be able to freely pick up the connector 1. In operation the chuck 3A is positionally located centrally above the alignment block 4. The cylinder 3C is then lowered until the end portions 14 of the pins 1A are respectively inserted into the alignment apertures 4A of the alignment block 4. The chuck 3A then separates, from the connector 1, leaving the connector 1 fitted to the alignment block 4.

During this operation, the connector 1 is easily fitted to the alignment block 4 due to the tapered entrance to the alignment apertures 4A, and any misalignment of the pins 1A with the housing 1B is corrected.

Then, once the connector 1 has been fitted, the alignment block 4 is moved to beneath the press head 6. Due to the weak nature of the mounting of the pins 1A in the housing 1B there may be cases where a pin 1A becomes inclined with respect to the housing 1B. With the present embodiment however, even if a pin 1A is slightly inclined in this way, this is corrected with insertion into the tapered entrance to an alignment aperture 4A in the alignment block 4.

Furthermore, any shock at the time of fitting the connector 1 to the alignment block 4 is softened due to the alignment block 4, as shown in FIG. 3, being resiliently supported with respect to the assembly plate 5A by means of compression coil springs 4D and shafts 4C.

As shown in FIG. 3, the alignment apertures 4A pass into a chamber 4B. The chamber 4B is connected to a pump (not shown in the figure) being part of the equipment. On one hand, when the connector 1 is fitted to the alignment block 4, the pressure inside the chamber 4B is reduced through operation of the pump so that the connector 1 is held by a vacuum. On the other hand, when the connector 1 is to be released, (that is to say once the connector 1 is attached to the press head 6) the pressure in the chamber 4B is increased by supplying compressed air thereto, to facilitate release of the connector 1 from the alignment block 4.

As a result, when the press head 6 is attached to the connector 1 by vacuum, the vacuum holding force can be made sufficient to ensure that the connector 1 is not held back by the friction force between the pins 1A and alignment apertures 4A. Also the pressure inside the chamber 4B, ensures that the connector 1 is reliably delivered to the press head 6.

Also as shown in FIG. 3, a plurality of apertures 6A are provided in the press head 6 to take the upper portions 13 (at the opposite end to the end portion 14) of the pins 1A so that the press face 6B of the press head 6 contacts shoulders of the attachment portions 12 of the pins 1A. These apertures 6A pass into a chamber 6C which is connected to a pump so that the pressure inside the chamber 6C can be reduced.

On lowering the press head 6 by the press 7 (see FIG. 1), the upper portions 13 of the pins 1A are inserted into the apertures 6A, and the connector 1 is attached to the press head 6 by reducing the pressure in the chamber 6C.

Once the press head 6 has attached to the connector 1, the press head 6 is raised. The alignment block 4 is then moved horizontally (to the right in FIG. 3) to the previous position (as shown in FIG. 1) to carry out a similar operation with the next connector 1 which has been supplied to this position by the chuck 3A.

Figure 4:
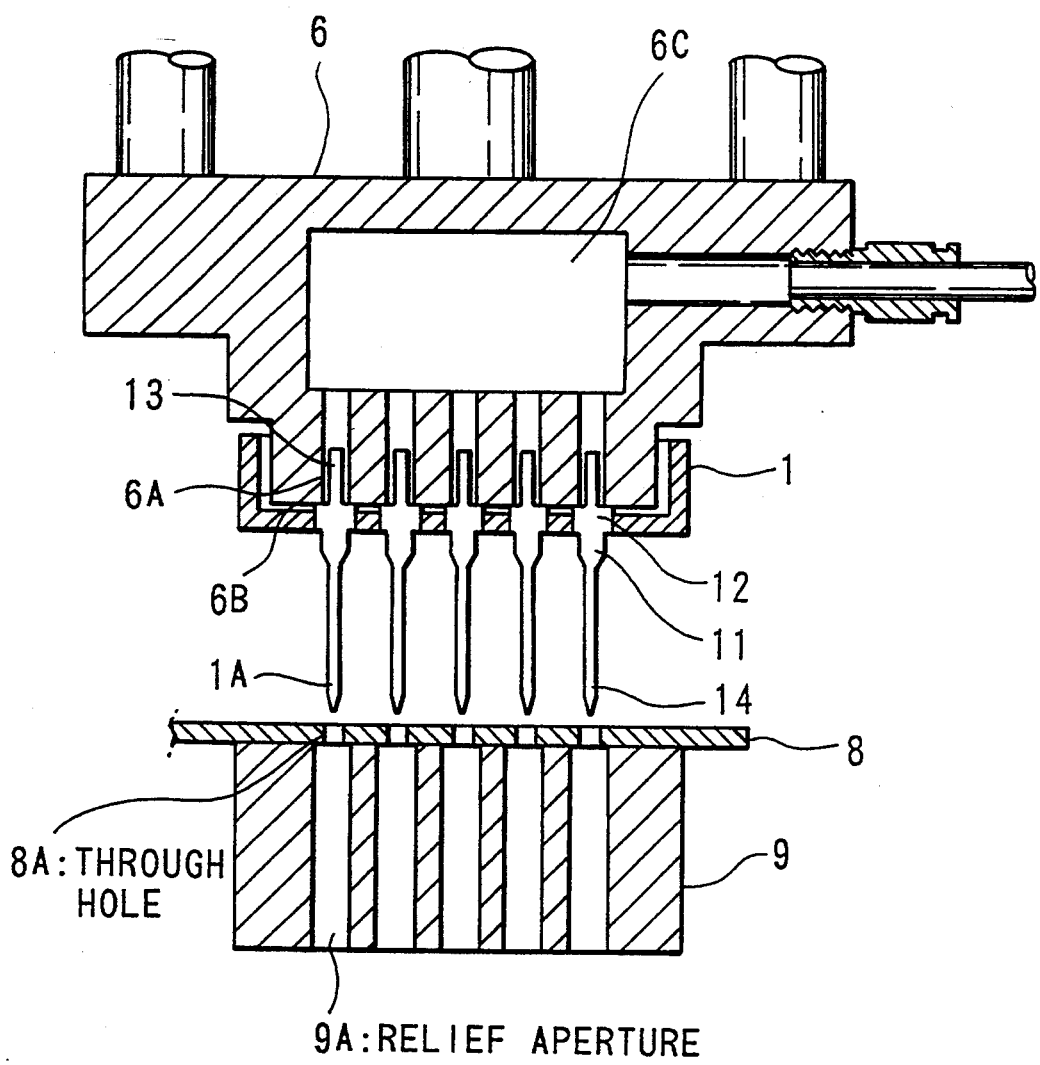
FIG. 4 is a cross sectional enlarged end view of the apparatus as shown in FIG. 3 showing a connector attached by vacuum to the press head.
Figure 7:
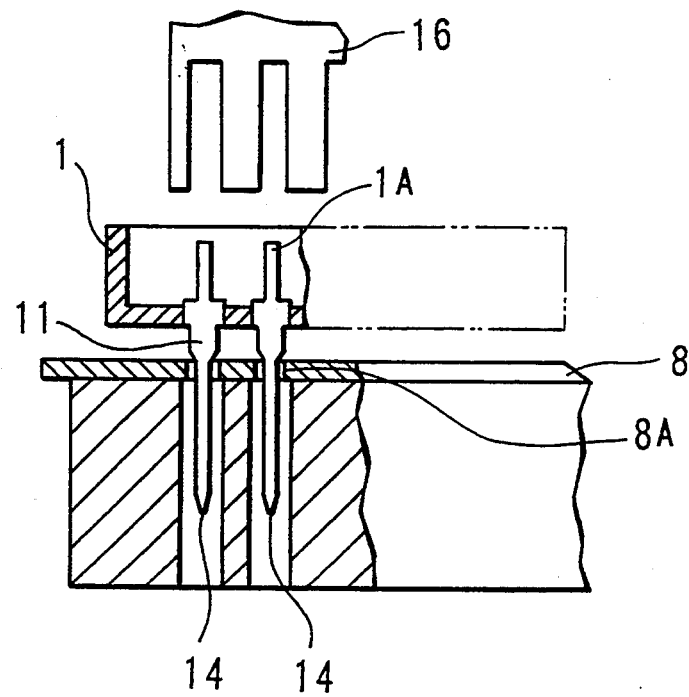
FIG. 7 is a detailed partially sectioned view of the conventional apparatus, showing a condition prior to the apparatus press-fitting the connector to the printed circuited board.
Figure 8:
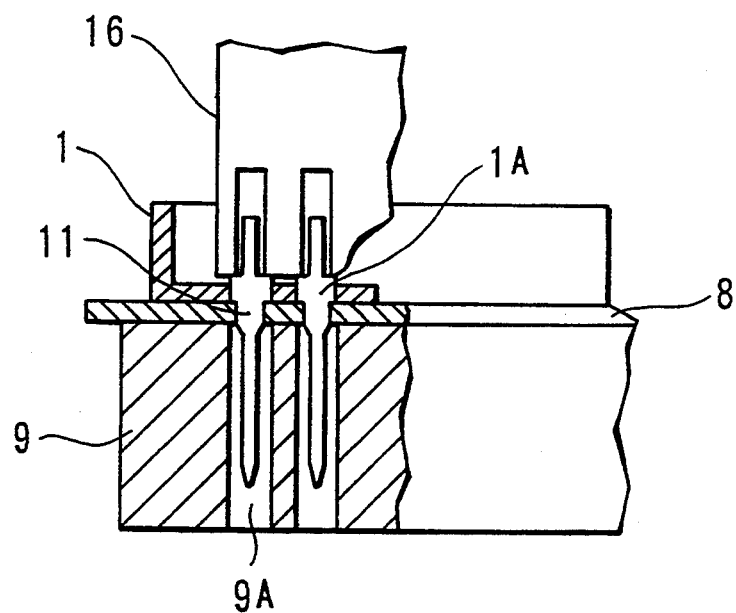
FIG. 8 is a detailed partially sectioned view of the conventional apparatus, showing the condition after the connector has been press-fitted to the printed circuited board.

The press head 6 is then lowered to press the attached connector 1 against the printed circuit board 8. FIG. 4 shows the condition immediately prior to this.

After pressing the connector 1 so that the press-fit portions 11 are fully inserted into the through holes 8A, the press head 6 is released from the connector 1 and raised, ready to carry out a similar movement with respect to the next connector 1 supplied by the alignment block 4.

With the embodiment as described above, the connector 1 is removed from the storage unit 2 and carried by the chuck 3A to the alignment block 4 where the pins 1A of the connector 1 are aligned by insertion into the alignment block 4, and any misalignment corrected. The alignment block 4 then moves to the press head 6 which attaches to connector 1. The alignment block 4 is then removed, and the press 7 operated to press the connector 1 downward against the printed circuit board 8. The operation of half-mounting the connector 1 on the printed circuit board 8 is thus eliminated so that automation of the connector 1 insertion operation becomes possible.

We claim:

1. An apparatus for press-fitting a connector to a printed circuit board, said apparatus comprising:
   a storage unit for accommodating a plurality of connectors for the printed circuit board, said connectors having a plurality of pins each with an outer diameter of an end portion smaller than an outer diameter of an intermediate portion;
   a first transport mechanism for moving a chuck used to releasably hold a connector;
   an alignment block having alignment apertures each with a tapered entrance thereto and a diameter larger than the outer diameter of said end portion and smaller than the outer diameter of said intermediate portion, provided so as to correspond to the locations of the pins of the connector;
   a second transport mechanism for moving the alignment block in a horizontal direction;
   a press head for releasably holding the connector;
   a press for moving the press head in a vertical direction so as to press-fit a connector attached thereto to a printed circuit board; and
   a die for mounting the printed circuit board, said die having relief apertures each with a diameter larger than the outer diameter of the intermediate portion, and disposed so as to correspond to the positions of the pins of the connector.

2. An apparatus for press-fitting a connector to a printed circuit board as claimed in claim 1, wherein a chamber penetrated by the alignment apertures is provided in the alignment block such that the pressure in said chamber can be increased or decreased.

3. An apparatus for press-fitting a connector to a printed circuit board as claimed in claim 1, wherein the press head has apertures corresponding to the positions of the pins of the connector, each with a diameter larger the outer diameter of an opposite end portion of the pin, and a chamber which is penetrated by the apertures, and in which the pressure can be reduced.

4. A method for press-fitting a connector to a printed circuit board, said method comprising the steps of:
   accommodating in a storage unit, a plurality of connectors for the printed circuit board, said connectors having a plurality of pins each with an outer diameter of an end portion smaller than an outer diameter of an intermediate portion;
   removing a connector from the magazine by means of a chuck;
   providing in an alignment block, alignment apertures each with a tapered entrance thereto and a diameter larger than the outer diameter of said end portion and smaller than the outer diameter of said intermediate portion, so as to correspond to the locations of the pins of the connector;
   moving the chuck horizontally as far as the alignment block, and mounting the connector on the alignment block so that each of the pins are inserted into the alignment apertures;
   moving the alignment block in a horizontal direction to a position beneath a press head;
   attaching the connector mounted on the alignment block to the press head;
   mounting the printed circuit board, on a die, said die having relief apertures each with a diameter larger than the outer diameter of the intermediate portion and disposed so as to correspond to the positions of the pins of the connector; and
   pressing said attached connector with said press head so as to press-fit said connector to said printed circuit board.

5. An method for press-fitting a connector to a printed circuit board as claimed in claim 4, wherein a chamber penetrated by the alignment apertures is provided in the alignment block, and the pressure in said chamber is decreased when the chuck fits the connector to the alignment block, and is increased when the press head attaches to the connector.

6. An method for press-fitting a connector to a printed circuit board as claimed in claim 4, wherein the press head has apertures corresponding to the positions of the pins of the connector, each with a diameter larger than the outer diameter of an opposite end portion of the pin, and a chamber which is penetrated by the apertures, and the pressure in said chamber is reduced when the press head attaches to the connector.

* * * * *

UNITED STATES PATENT AND TRADEMARK OFFICE
CERTIFICATE OF CORRECTION

PATENT NO. : 5,400,502
DATED : March 28, 1995
INVENTOR(S) : Yasunori OTA et al

It is certified that error appears in the above-indentified patent and that said Letters Patent is hereby corrected as shown below:

Claim 3, Column 5, Line 41 before "the" (First Occurrence) insert --than--.

Signed and Sealed this

Twenty-sixth Day of September, 1995

Attest:

BRUCE LEHMAN

Attesting Officer                Commissioner of Patents and Trademarks